US008426750B2

(12) United States Patent
Lee et al.

(10) Patent No.: US 8,426,750 B2
(45) Date of Patent: Apr. 23, 2013

(54) ELECTROMAGNETIC SHIELDING STRUCTURE HAVING NEGATIVE PERMITTIVITY AND METHOD OF MANUFACTURING THE SAME

(75) Inventors: Hong Min Lee, Hwaseong-si (KR); Joong Kwan Kim, Suwon-si (KR)

(73) Assignee: Kyonggi University Industry & Academia Cooperation Foundation, Suwon-Si (KR)

( * ) Notice: Subject to any disclaimer, the term of this patent is extended or adjusted under 35 U.S.C. 154(b) by 567 days.

(21) Appl. No.: 12/561,951

(22) Filed: Sep. 17, 2009

(65) Prior Publication Data

US 2010/0065325 A1 Mar. 18, 2010

(30) Foreign Application Priority Data

Sep. 17, 2008 (KR) .................. 10-2008-0091092

(51) Int. Cl.
*H05K 9/00* (2006.01)
(52) U.S. Cl.
USPC .......................................... 174/384; 174/377
(58) Field of Classification Search .................. 174/355, 174/377, 384; 333/12; 361/816
See application file for complete search history.

(56) References Cited

U.S. PATENT DOCUMENTS

| 5,360,941 | A | * | 11/1994 | Roes | 174/378 |
| 5,455,117 | A | * | 10/1995 | Nagano et al. | 428/545 |
| 5,539,150 | A | * | 7/1996 | Kipka | 174/350 |
| 5,761,054 | A | * | 6/1998 | Kuhn | 361/818 |
| 5,796,335 | A | * | 8/1998 | Droege et al. | 340/550 |
| 6,097,271 | A | * | 8/2000 | Kozakoff | 333/204 |
| 2003/0224681 | A1 | * | 12/2003 | Koch | 442/131 |
| 2004/0000416 | A1 | * | 1/2004 | Hou | 174/35 MS |
| 2004/0213939 | A1 | * | 10/2004 | Hsu et al. | 428/40.1 |
| 2005/0029919 | A1 | * | 2/2005 | Notohara et al. | 313/326 |
| 2005/0244608 | A1 | * | 11/2005 | Arakawa et al. | 428/137 |
| 2009/0021323 | A1 | * | 1/2009 | Lee | 333/12 |
| 2009/0080172 | A1 | * | 3/2009 | Arslan et al. | 361/816 |
| 2009/0178842 | A1 | * | 7/2009 | Liu | 174/389 |
| 2011/0084782 | A1 | * | 4/2011 | Kanno | 333/202 |

FOREIGN PATENT DOCUMENTS

| KR | 1020020086025 | 11/2002 |
| KR | 2020030034291 | 5/2003 |
| KR | 1020050028425 | 3/2005 |
| KR | 1020080060434 | 7/2008 |

* cited by examiner

*Primary Examiner* — Hung Ngo
(74) *Attorney, Agent, or Firm* — IPLA P.A.; James E. Bame (57) ABSTRACT

Provided are an electromagnetic shielding structure and a method of manufacturing the electromagnetic shielding structure. The electromagnetic shielding structure shields an electromagnetic wave having a specific frequency band, is miniaturized, and includes a strip line, and a couple of plate structures facing each other and connected to both ends of the strip line. The method of manufacturing the electromagnetic shielding structure is simple. An electromagnetic wave having a specific frequency band is shielded, and variation in electromagnetic shielding performance according to the position of an electromagnetic shielding construction is prevented, thus constructing a reliable electromagnetic shielding concrete building.

9 Claims, 7 Drawing Sheets

ELECTROMAGNETIC SHIELDING STRUCTURE HAVING NEGATIVE PERMITTIVITY AND METHOD OF MANUFACTURING THE SAME

BACKGROUND OF THE INVENTION

1. Field of the Invention

The present invention relates to an electromagnetic shielding structure and a method of manufacturing the electromagnetic shielding structure, and more particularly, to an electromagnetic shielding structure and a manufacturing method thereof that are capable of permanently shielding electromagnetic waves, significantly improving frequency selectivity of electromagnetic waves to be shielded, and being miniaturized and conveniently stored.

2. Description of the Related Art

Various multimedia service environments such as mobile terminals and wireless network environments are quickly increasing all throughout the world. Accordingly, electromagnetic wave-related issues are growing concern. The effect of electromagnetic waves cause enormous losses in terms of the malfunctioning and interference of precision equipment, continuous disruption of power facilities, dangers to human health, leakage of personal information from information devices, etc. Safety standards for electromagnetic waves are being established, and electromagnetic shielding materials are being actively developed in countries around the world. While research on electromagnetic wave shielding in Korea was begun in earnest in late 2002, the importance of strategic infrastructures as well as technical research remain lacking. Thus, the importance of research on electromagnetic wave shielding is growing.

Chemical shielding materials for electromagnetic waves may be classified into shielding paint, shielding fiber, and other materials.

Shielding paints include plastic housing shielding paint, electromagnetic shielding coating material, and electromagnetic wave absorbing/shielding inorganic paint.

Plastic housing shielding paint is formed of material having high conductivity that is applied as a shielding layer on insulating plastic to provide electromagnetic shielding characteristics. However, it is technically difficult to apply plastic as a base to a structure. Electromagnetic shielding coating materials are formed by mixing conductive particles and paint resin, and are applied as a layer to a target structure for shielding electromagnetic waves. Electromagnetic shielding coating materials are useful for electronic devices, homewares, and sundries. However, since electromagnetic shielding coating materials are expensive, their application to construction and civil engineering fields is economically unfeasible. Electromagnetic wave absorbing/shielding inorganic paints include magnetic powder and carbon that absorb/shield electromagnetic waves. Because electromagnetic shielding performance improves with the number of applications, it is difficult to apply electromagnetic wave absorbing/shielding inorganic paints to materials that require high strength, such as concrete.

Shielding fibers include metal film forming fiber, copper compound adhering fiber, conductive resin coating fiber, metal thin film laminating fiber, metal twine fiber, carbon pulp fiber, and shielding Korean paper.

Such a metal film forming fiber includes a metal film obtained by forming conductive material on the surface of a fiber through sputtering or depositing. It is also difficult to apply metal film forming fibers to structures of buildings, such as walls, columns, and beams. A copper compound adhering fiber is formed by adding and adhering copper to a synthetic fiber. A conductive resin coating fiber is formed by coating yarn with a mixture of metal oxide, carbon black, and adhesive. Since both copper compound adhering fiber and conductive resin coating fiber have poor shielding performance, their commercialization is difficult. A metal thin film laminating fiber is formed by laminating a surface of a fiber with a metal thin film. A metal twine fiber is formed by entwining a metal fiber and a typical fiber such as cotton or synthetic fiber.

Although both metal thin film laminating fiber and metal twine fiber have high electromagnetic shielding performance, their fiber characteristics do not render them suitable for applications in structures of buildings. Carbon pulp fibers are flexible, and are thus easily adaptable for uneven surfaces. However, because carbon pulp fibers have poor strength, it is technically difficult to apply them to structures of buildings. Shielding Korean paper is formed of a carbon fiber and a bark fiber from a paper mulberry, and has high electromagnetic shielding performance. However, since such shielding Korean papers are expensive, it is economically difficult to apply them to structures of buildings.

Chemical shielding materials for electromagnetic waves also include shielding tapes, electromagnetic shielding construction materials, shielding screens, and shielding glasses.

Shielding tape is formed by applying a synthetic resin film on a surface of an aluminum thin film, and coating another surface with adhesive. Such a shielding tape is attached to a surface of a target object, and then a synthetic resin film is removed from a shielding tape to provide shielding performance. An electromagnetic shielding construction material, formed by coating a surface of metal thin film with adhesive, is attached to a surface of wall paper. However, the tape characteristics of both a shielding tape and an electromagnetic shielding construction material make it difficult to apply them to structures of buildings. Shielding screens are formed of copper alloy including nickel and tin. Shielding glass is formed of glass including a mesh-shaped metal material having high conductivity. Although both a shielding screen and a shielding glass can be used for expensive electronic appliances or special-purpose products, they are too expensive to be applied to structures of buildings.

Thus, it is difficult to apply the aforementioned chemical electromagnetic shielding materials in large quantities to structures of buildings because of unsuitable properties, difficulties in construction, or economical limitations.

Aside from the aforementioned chemical electromagnetic shielding materials, a physical member formed by periodically disposing protruding blocks on a concreted slab constituting a building, and spacing iron reinforcing rods a predetermined distance in the slab is used to shield/absorb electromagnetic waves.

Such physical electromagnetic shielding members are adapted for noise and low frequency electromagnetic waves. However, since physical electromagnetic shielding members should have minute block structures to shield high frequency electromagnetic waves, frequency selection and construction are difficult to implement.

In addition, electromagnetic waves having specific frequencies are shielded, but electromagnetic waves having wide frequency bands are difficult to shield.

Thus, research has been actively carried out to apply electromagnetic shielding members and methods of manufacturing electromagnetic shielding members to construction fields.

For example, Korean Patent Publication No. 10-2005-0028425 (published on Mar. 23, 2005) discloses a fire-resistant panel for construction, in which inorganic fiber nets are buried between two boards, gauze planes are disposed on retreated parts and projected parts on sides, and fillers fill the inner space between the two boards.

The fire-resistant panel includes the inorganic fiber nets to perform an electromagnetic shielding function and a fire-proofing function. However, the electromagnetic shielding function of the inorganic fiber nets is insufficient, and particularly, it is difficult to shield electromagnetic waves having wide frequency bands, and apply the fire-resistant panel to walls or ceilings of buildings, plus, its cost is high.

In addition, Korean Patent Publication No. 10-2003-0034291 (published on May 9, 2003) discloses an electromagnetic shielding material, which includes steel slag, byproducts generated from steel manufacturing, and an electromagnetic shielding material to shield electromagnetic waves.

The electromagnetic shielding material is adapted to recycle slag generated from steel manufacturing. However, it is difficult to shield electromagnetic waves having wide frequency bands, and slag has unsuitable physical properties. Thus, it is difficult to apply the electromagnetic shielding material to walls or ceilings of buildings.

In addition, Korean Patent Publication No. 10-2002-0086025 (published on Nov. 18, 2002) discloses a construction complex product intermixed with amorphous alloy, which is manufactured by weaving the amorphous alloy in a lattice pattern within a mold and filling mortar therein to mold a desired complex product.

The construction complex product intermixed with amorphous alloy has a simple structure, and is inexpensive. However, it is difficult to shield electromagnetic waves having wide frequency bands. In addition, since mortar is filled in the mold for molding, the construction complex product has a low strength. Thus, it is difficult to apply the construction complex product to walls or ceilings of buildings.

In addition, Korean Patent Publication No. 10-2008-0060434 (published on Jul. 2, 2008) discloses an electromagnetic shielding unit and an electromagnetic shielding structure, which selectively shield electromagnetic waves having a specific frequency, and are mixed with concrete.

The electromagnetic shielding unit is adapted to shield electromagnetic waves having a specific frequency. However, when manufacturing a 3-dimensional parallel resonator structure, supports crossing each other in the middle of the structure are difficult to manufacture and expensive. In addition, it takes a long time to manufacture the supports through welding.

In addition, it is difficult for the related art electromagnetic shielding materials to be uniformly disposed in a building. Furthermore, when the related art electromagnetic shielding materials may be removed from a portion of a building over time, a portion of electromagnetic waves passing through a building may not be shielded. Thus, a technology for improving electromagnetic shielding reliability by semi-permanently and uniformly providing an electromagnetic shielding performance to a building is required.

SUMMARY OF THE INVENTION

Accordingly, the present invention is directed to an electromagnetic shielding structure having negative permittivity and a method of manufacturing the electromagnetic shielding structure, which substantially obviate one or more problems due to limitations and disadvantages of the related art.

It is an object of the present invention to provide an electromagnetic shielding structure that selects and effectively shields an electromagnetic wave having a specific frequency and is attached to a surface of a concrete block for construction.

It is another object of the present invention to provide an electromagnetic shielding structure that effectively shields an electromagnetic wave, reduces the number of manufacturing processes and a manufacturing cost, and is conveniently stored.

It is another object of the present invention to provide a method of manufacturing an electromagnetic shielding structure, which effectively shields an electromagnetic wave, reduces a manufacturing cost, and is simple.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In another aspect of the present invention, there is provided an electromagnetic shielding structure including: a dielectric having a film shape; a strip line printed on an upper surface of the dielectric; and a couple of plate structures printed on the upper surface of the dielectric and connected to both ends of the strip line.

In another aspect of the present invention, there is provided a method of manufacturing an electromagnetic shielding structure, the method including: manufacturing a rectangular parallelepiped block member for adjusting a specific gravity; manufacturing a 'T'-shaped dielectric having a film shape for covering a surface of the block member; printing a conductive pattern that includes three strip lines without a short circuit therebetween on an upper surface of the dielectric, and that includes three couples of plate structures, each couple connected to both ends of each of the strip lines; and attaching a lower surface of the dielectric having the conductive pattern to the surface of the block member.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. However, the present invention is not limited to the embodiments illustrated herein after, and the embodiments herein are rather introduced to provide easy and complete understanding of the scope and spirit of the present invention.

Figure 1:
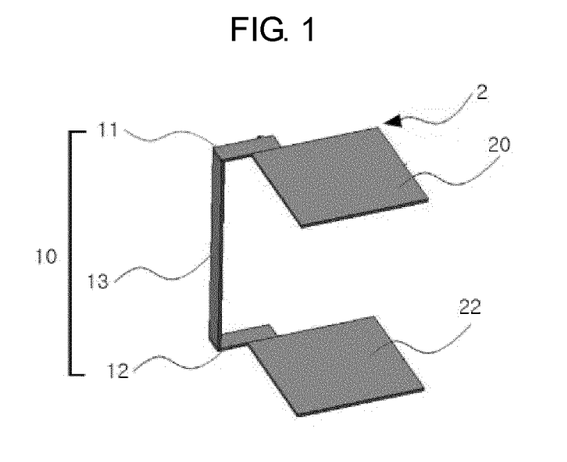
FIG. 1 is a perspective view illustrating an electromagnetic shielding structure according to an embodiment of the present invention.

FIG. 1 is a perspective view illustrating an electromagnetic shielding structure 2 according to an embodiment of the present invention. Referring to FIG. 1, the electromagnetic shielding structure 2 is disposed in a structure such as a wall for dividing a building or a space, so as to shield electromagnetic waves. The electromagnetic shielding structure 2 includes a strip line 10 and a couple of plate structures 20 and 22 coupled to both ends of the strip line 10.

The strip line 10, having a 'U'-shape, is formed of conductive material such as metal, which functions as an inductor. The plate structures 20 and 22 are formed of conductive material such as metal, and face each other connected to both the ends of the strip line 10. The plate structures 20 and 22 function as a capacitor.

More particularly, the strip line 10 may include a first horizontal line 11 and a second horizontal line 12 that respectively protrude from the plate structures 20 and 22 and are horizontal to the plate structures 20 and 22 parallel to each other, and a vertical strip line 13 connecting the first and second horizontal lines 11 and 12. When the electromagnetic shielding structure 2 is provided in plurality to constitute a structure having six surfaces, the first and second horizontal lines 11 and 12 prevent a short circuit between the adjacent electromagnetic shielding structures 2 and minimize coupling interference. The vertical strip line 13 connects the plate structures 20 and 22.

As such, since the inductance component and the capacitance component having opposite frequency characteristics are simultaneously disposed in the single structure, resonance occurs at a specific frequency f. Thus, the electromagnetic shielding structure 2 functions as a band stop filter that removes a specific frequency passing through the single structure.

A resonance frequency is a function of capacitance C and inductance L, which are determined by the size of the plate structures 20 and 22 facing each other or by the length of the strip line 10. Thus, so-called selectivity for removing an electromagnetic wave having a specific frequency can be controlled by adjusting the size of the plate structures 20 and or the length of the strip line 10. That is, the electromagnetic shielding structure 2 is adapted for selecting the frequency of an electromagnetic wave to be removed.

There are various methods of manufacturing the electromagnetic shielding structure 2. For example, the strip line 10 may be formed of metal such as copper (Cu), and integrally formed with metal plates in both ends thereof. Alternatively, the strip line 10 and metal plates are formed discretely, and then the strip line 10 is connected to the metal plates through welding.

Figure 2:
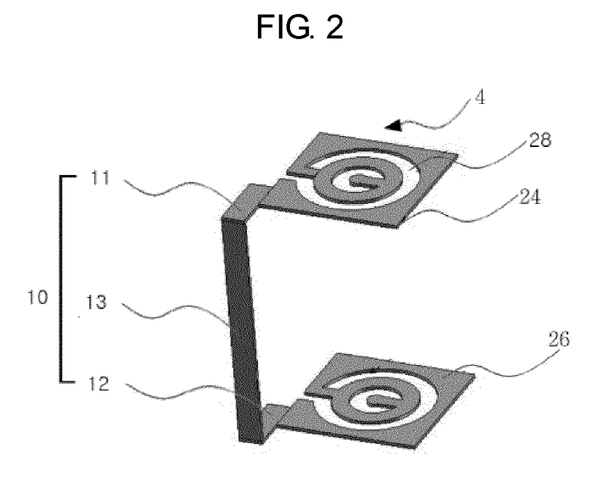
FIG. 2 is a perspective view illustrating an electromagnetic shielding structure according to another embodiment of the present invention.

FIG. 2 is a perspective view illustrating the electromagnetic shielding structure 4 according to another embodiment of the present invention. Referring to FIG. 2, the electromagnetic shielding structure 4 includes the strip line 10 and the plate structures 24 and 26 coupled to both ends of the strip line 10, the plate structures 24 and 26 may include a complementary split ring resonator (CSRR) structure 28 to miniaturize the electromagnetic shielding structure 4. More particularly, the plate structures 24 and 26 are provided with slits to have the CSRR structure 28 that is different from a split ring resonator (SRR) structure, and include CSRRs having different sizes to maximize the characteristics of the CSRR structure 28, and the strip line 10 functions as a stub for connecting the plate structures 24 and 26. For example, when each of sides of the plate structures 24 and 26 has a length of about 4.5 mm, each of the first and second strip lines 11 and 12 has a length of about 2 mm, and the vertical strip line 13 has a length of about 7 mm, the electromagnetic shielding structure 4 has a resonance frequency of about 2.13 GHz.

The CSRR structure 28, having an effective inductance component, is opposite in concept to the SRR structure having an effective capacitor component. Thus, when the plate structures 24 and 26 have the CSRR structures 28, an effective inductance value of the electromagnetic shielding structure 4 is increased. Thus, when the electromagnetic shielding structure 4 including the CSRR structures 28 has the same size at that of the electromagnetic shielding structure 4 without the CSRR structures 28, the former has the greater effective inductance value than that of the latter. That is, when the electromagnetic shielding structure 4 includes a structure for increasing an effective inductance value, a resonance frequency is decreased, thus achieving miniaturization.

The electromagnetic shielding structure 4 can be used to select the frequency of an electromagnetic wave to be shielded or adjust a bandwidth by varying the length of the strip line 10, the sizes of the plate structures 24 and 26, and the size of the CSRR structure 28.

When the electromagnetic shielding structure 4 is provided in plurality, the density of the electromagnetic shielding structures 4 provided to a portion of a construction may be relatively high. In this case, shielding of a microwave passing through the portion where the density of the electromagnetic shielding structures 4 is high is effective, but shielding of a microwave passing through a portion where the density of the electromagnetic shielding structures 4 is low may be difficult. This negatively affects reliability in shielding performance.

For example, when a building formed of concrete is constructed, the electromagnetic shielding structures 4 may be mixed with concrete to form a wall to provide an electromagnetic shielding performance. In this case, concrete including cement, aggregate, the electromagnetic shielding structures 4, and water has fluidity before hardening.

Thus, when the specific gravity of the electromagnetic shielding structures 4 is greater than that of the concrete, the electromagnetic shielding structures 4 are collected in the lower portion of the wall, so that electromagnetic waves may easily pass through the upper portion of the wall. On the other hand, when the specific gravity of the electromagnetic shielding structures 4 is less than that of the concrete, the electromagnetic shielding structures 4 are collected in the upper portion of the wall, so that an electromagnetic wave may easily pass through the lower portion of the wall.

As such, uneven distribution of the electromagnetic shielding structures 4 may degrade a local electromagnetic shielding performance and affect the solidity and durability of a building. That is, cement or aggregate is insufficient in a portion where the electromagnetic shielding structures 4 are collected, thus negatively affecting the solidity of the construction and degrading the long term durability of the building.

Thus, a block member, which is coupled to the plate structures 24 and 26 to adjust the specific gravity of the electromagnetic shielding structure 4, may be disposed between the plate structures 24 and 26. When the block member is added to the construction, and particularly, to a concrete mixture having fluidity, the construction has an improved electromagnetic shielding performance. The structure and material of the block member may be varied within the scope of the present invention, and a method of manufacturing the block member is not limited. That is, the block member may be any member for adjusting the specific gravity of the electromagnetic shielding structures 4 such that the member is coupled to each of the electromagnetic shielding structures 4 to make the density of the electromagnetic shielding structures in the construction uniform. More particularly, when the construction provided with the electromagnetic shielding structure 4 is formed of concrete or clay, the block member may be formed in a hexahedron, such as a rectangular parallelepiped and a regular hexahedron, with ceramic, concrete or clay having approximately the same specific gravity as that of the concrete or clay.

The electromagnetic shielding structure 4 has a two-way structure. Thus, when the electromagnetic shielding structures 4 are provided to various structures such as the construction, it is difficult for the electromagnetic shielding structures 4 to have directionality. When the electromagnetic shielding structures 4 are randomly disposed, the rotation of the electromagnetic shielding structures 4 degrades stopband characteristics.

To improve cross polarization characteristics according to directionality, the two electromagnetic shielding structure 4, having a two-way structure, may be coupled to constitute a four-way structure, or the three electromagnetic shielding structures 4 (parallel resonators) are coupled to each other along an x-axis, a y-axis, and a z-axis to constitute a six-way structure.

Figure 3:
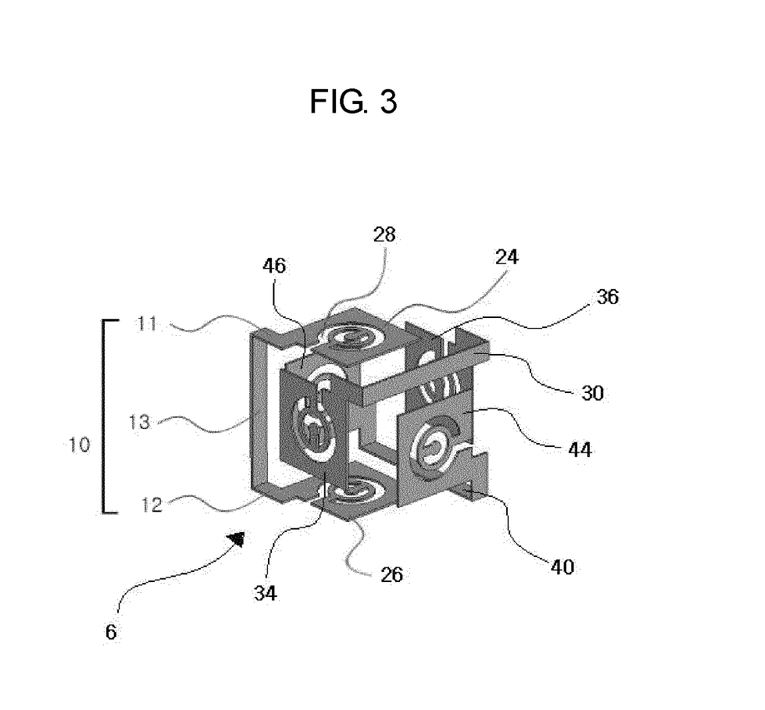
FIG. 3 is a perspective view illustrating a six-way electromagnetic shielding structure according to an embodiment of the present invention.
Figure 4:
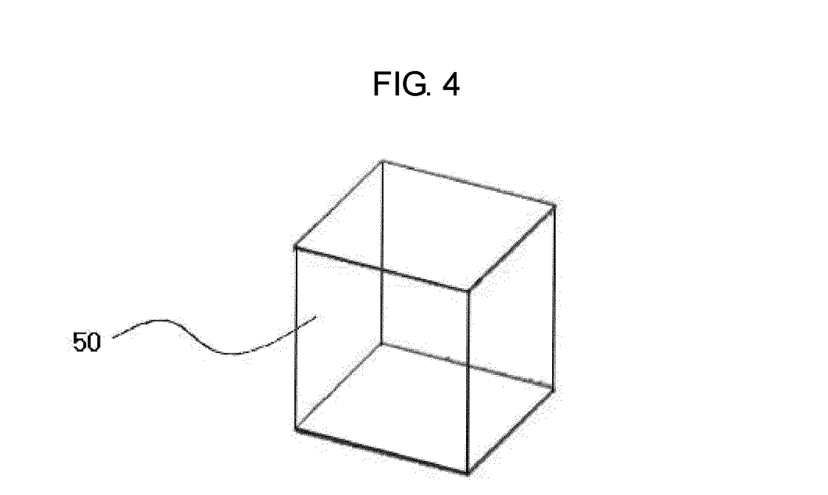
FIG. 4 is a perspective view illustrating a block member according to an embodiment of the present invention.
Figure 5:
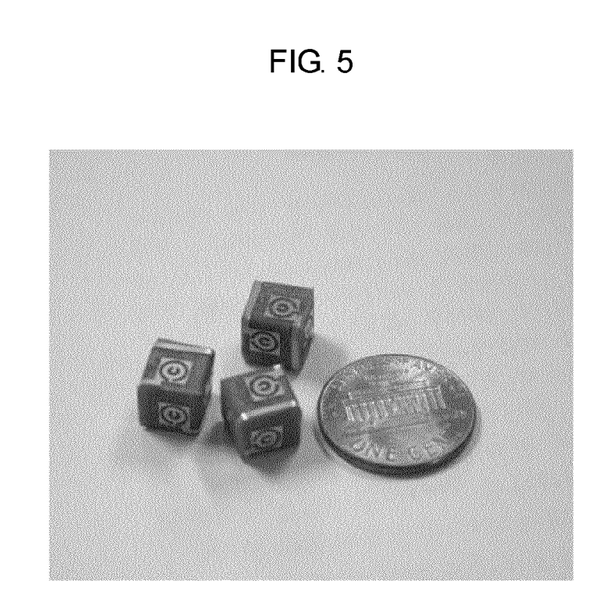
FIG. 5 is an image illustrating an electromagnetic shielding structures including a block member according to an embodiment of the present invention.

FIG. 3 is a perspective view illustrating a six-way structure of the electromagnetic shielding structures 6 according to an embodiment of the present invention. FIG. 4 is a perspective view illustrating a block member 50. FIG. 5 is an image illustrating the electromagnetic shielding structures 6 including the block member 50. In FIG. 5, the size of the electromagnetic shielding structures 6 including the block member 50 is compared with the size of the one cent coin.

Referring to FIGS. 3, 4 and 5, the six-way structure of the electromagnetic shielding structures 6 may include a couple of plate structures 24 and 26 covering one of the back-and-forth, left-and-right and up-and-down directions of the block member 50, a strip line 10 connecting the plate structures 24 and 26, a couple of plate structures 34 and 36 and a couple of plate structures 44 and 46 covering the rest of the back-and-forth, left-and-right and up-and-down directions, a strip line 30 connecting the plate structures 34 and 36, and a strip line 40 connecting the plate structures 44 and 46.

That is, the six-way structure of the electromagnetic shielding structures 6 is formed by three-dimensionally coupling the three electromagnetic shielding structures 4 having a two-way structure as illustrated in FIG. 2. Thus, the three parallel resonators are configured to operate in x-axis, y-axis, and z-axis directions, thus improving the cross polarization characteristics.

Figure 6:
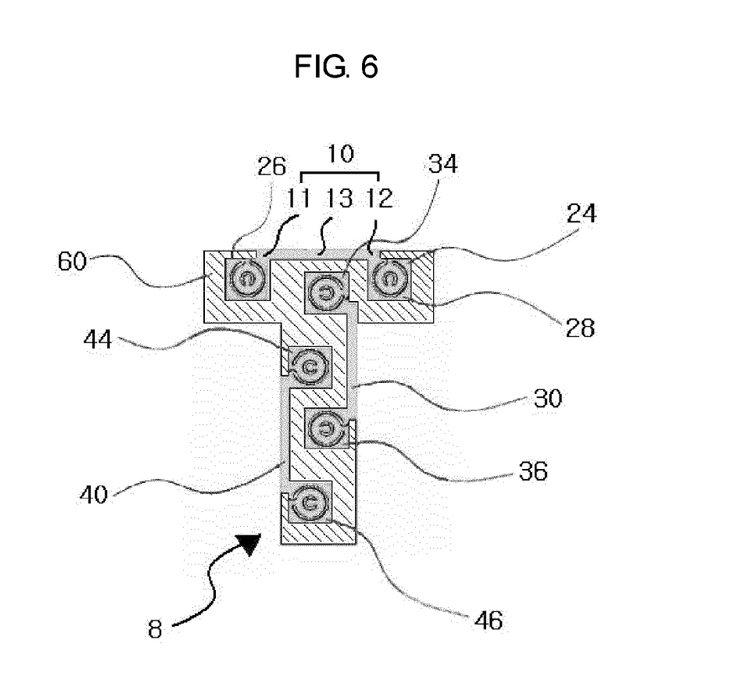
FIG. 6 is a plan view illustrating electromagnetic shielding structures according to an embodiment of the present invention.
Figure 7:
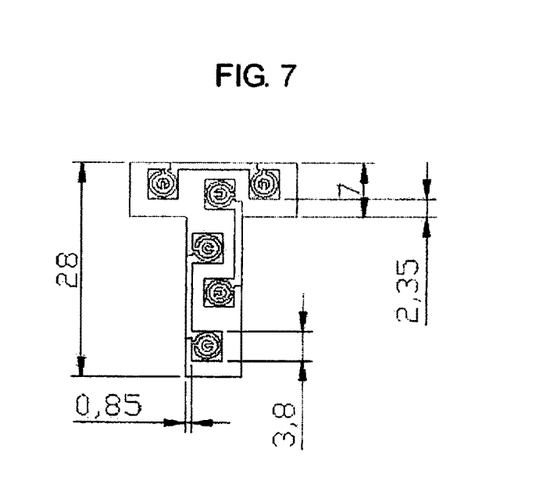
FIG. 7 is a plan view illustrating detailed dimensions of the electromagnetic shielding structures of FIG. 6.
Figure 8:
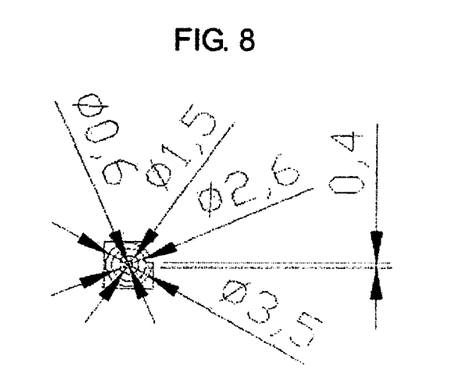
FIG. 8 is a plan view illustrating detailed dimensions of the electromagnetic shielding structures of FIG. 6.
Figure 9:
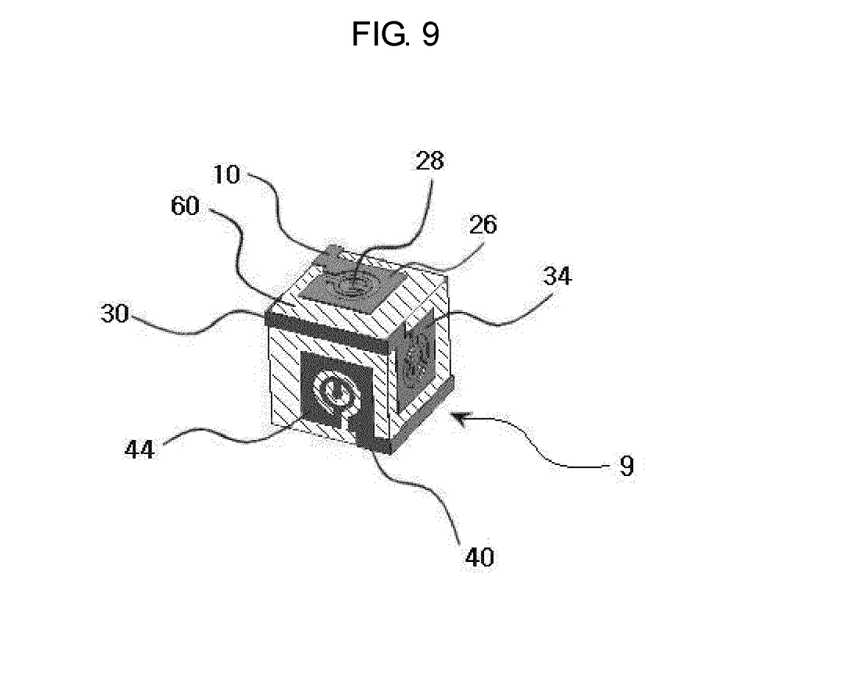
FIG. 9 is a perspective view illustrating electromagnetic shielding structures including a block member according to an embodiment of the present invention.

FIG. 6 is a plan view illustrating an electromagnetic shielding structure 8 according to an embodiment of the present invention. FIGS. 7 and 8 are plan view illustrating detailed dimensions of the electromagnetic shielding structures 8 of FIG. 6. FIG. 9 is a perspective view illustrating the electromagnetic shielding structures 8 including the block member (not shown).

Referring to FIGS. 6, 7 and 8, the electromagnetic shielding structures 8 according to the current embodiment includes a film-shaped dielectric 60, the strip line 10 of FIG. 1 or 2 printed on the upper surface of the dielectric 60, and the plate structures 20 and 22 (24 and 26) of FIG. 1 or 2 printed on the upper surface of the dielectric 60 for connecting to both ends of the strip line 10, so as to miniaturize the electromagnetic shielding structure 2 or 4 of FIG. 1 or 2 and simplify a method of manufacturing the electromagnetic shielding structure 2 or 4 of FIG. 1 or 2.

Referring to FIGS. 6 and 9, the electromagnetic shielding structures 9 may include the block member (not shown) that is adhered to the lower surface of the dielectric 60 to adjust the specific gravity of the electromagnetic shielding structures 9. The strip line 10 is integrally formed with the plate structures 24 and 26 in a conductive pattern. The strip line 10 functions as an inductor, and the plate structures 24 and 26 function as a capacitor.

More particularly, the dielectric 60 is formed in a 'T'-shaped film, and the strip line 10 may include the first and second strip lines 11 and 12 horizontal to the plate structures 24 and 26 parallel to each other and protruding from the plate structures 24 and 26, and the vertical strip line 13 connecting the first and second strip lines 11 and 12. The first and second strip lines 11 and 12 prevent a short circuit between adjacent ones of the electromagnetic shielding structures 9 forming six surfaces, and prevent coupling interference. The vertical strip line 13 connects the plate structures 24 and 26.

The plate structures 24 and 26 may be provided with CSRR structures to miniaturize the electromagnetic shielding structures 9.

For example, as illustrated in FIG. 8, the dielectric 60 has a length of about 28 mm, a thickness of about 0.01 mm, a width of about 7 mm, and a permittivity of about 4.4. Since concrete has a permittivity of about 6, the permittivity of the dielectric 60 is less than that of concrete, but this does not affect a cutoff resonance frequency to be filtered. Each of the sides of the plate structures 24 and 26 has a length of about 4.5 mm. Each of the first and second strip lines 11 and 12 has a length of about 2 mm. The vertical strip line 13 has a length of about 7 mm.

The electromagnetic shielding structure 9 can be used to select the frequency of an electromagnetic wave to be shielded, or adjust a bandwidth by varying the length of the strip line 10, the sizes of the plate structures 24 and 26, and the size of the CSRR structure.

The electromagnetic shielding structure 4 in FIG. 2 has a two-way structure. Thus, when the electromagnetic shielding structures 4 are provided to various structures such as the construction, it is difficult for the electromagnetic shielding structures 4 to have directionality. When the electromagnetic shielding structures 4 are disposed without directionality, the randomly rotated state of the electromagnetic shielding structures 4 degrades stopband characteristics. To improve cross polarization characteristics according to directionality, the strip lines 10, 30, and 40, and the plate structures 24, 26, 34, 36, 44, and 46 may be formed on the upper surface of the dielectric 60 through coating, so as to constitute a six-way electromagnetic shielding structure that covers all of the surfaces of the block member having, a hexahedron shape. More particularly, the strip lines 10, 30, and 40 may be printed without a short circuit therebetween on the upper surface of the dielectric 60. The plate structures 24 and 26 may be connected to both ends of the strip line 10 to face each other. The plate structures 34 and 36 may be connected to both ends of the strip line 30 to face each other. The plate structures 44 and 46 may be connected to both ends of the strip line 40 to face each other.

Figure 10:
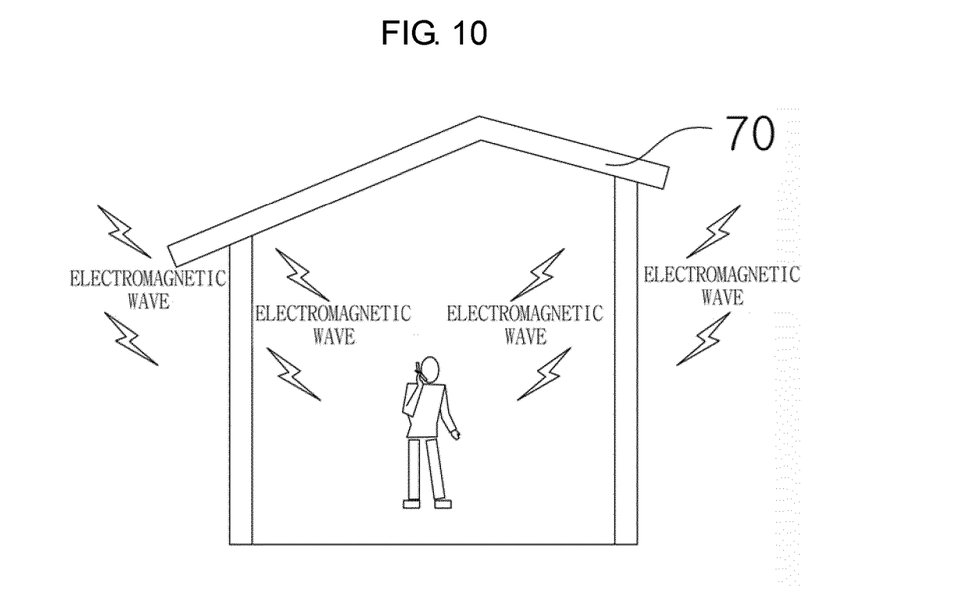
FIG. 10 is a cross-sectional view illustrating a structure without an electromagnetic shielding structure according to an embodiment of the present invention.
Figure 11:
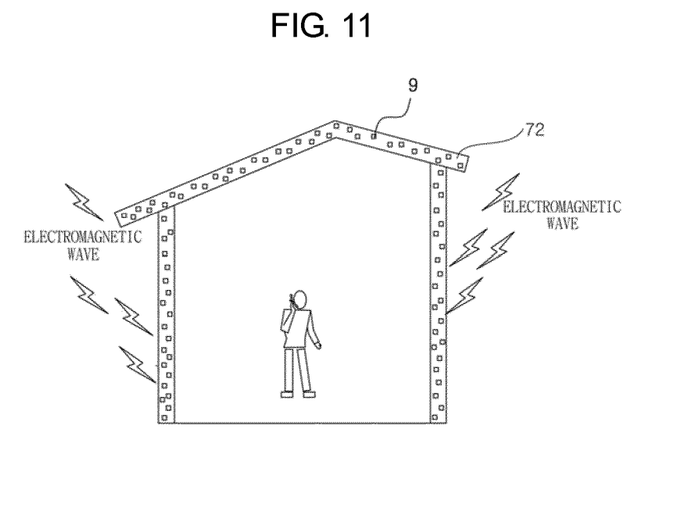
FIG. 11 is a cross-sectional view illustrating a structure including electromagnetic shielding structures according to an embodiment of the present invention.

FIG. 10 is a cross-sectional view illustrating a construction without the electromagnetic shielding structure 9. FIG. 11 is a cross-sectional view illustrating the construction 50 including the electromagnetic shielding structure 9.

The construction 70 of FIG. 10 and the construction 72 of FIG. 11 are typical buildings. Specifically, the construction 72 of FIG. 11 is any building including the electromagnetic shielding structures 9 therein. Particularly, the construction 72 may be one of a building formed of concrete or clay mixed with the electromagnetic shielding structures 9, a prefabricated building to which the electromagnetic shielding structures 9 are arrayed and fixed, and a panel formed of wood or synthetic resin. Alternatively, brick-shaped blocks including at least one of the electromagnetic shielding structures 9 may be fabricated, and then stacked in a brick structure, so as to construct the construction 72.

The construction 72 includes one or more electromagnetic shielding structures 9 to filter an identical frequency band and frequency bands different from each other. The electromagnetic shielding structure 9 includes the strip line, the plate structures connected to both ends of the strip line to face each other, and the block member that is disposed between the plate structures and to adjust the specific gravity of the electromagnetic shielding structure 9 such that the electromagnetic shielding structures 9 are uniformly distributed in the construction 72.

Referring to FIG. 11, when the construction 72 includes the electromagnetic shielding structures 9, the sizes of the plate structures and included in the electromagnetic shielding structures 9, the lengths of the strip lines, and the sizes of the CSRR structures are adjusted to shield electromagnetic waves having two or more frequencies different from each other or adjust a band to be filtered.

As such, when the electromagnetic shielding structures 9 are provided to the construction 72, electromagnetic waves introduced from the surroundings of the construction 72 are effectively shielded, unlike the structure 70 of FIG. 10 without the electromagnetic shielding structure 9. Thus, the electromagnetic shielding structures 9 are provided to a construction requiring the shielding of electromagnetic waves, such as security facilities, medical facilities concerning the malfunction of medical appliances due to electromagnetic interference, and examination rooms concerning cheating through communication devices, so as to fundamentally shield electromagnetic waves.

According to an embodiment of the present invention, a method of manufacturing the electromagnetic shielding structure 9 configured as described above includes a first operation of manufacturing the block member for adjusting the specific gravity of the electromagnetic shielding structure 9, a second operation of manufacturing the 'T'-shaped dielectric 60 having a film shape for covering the surfaces of the block member, a third operation of printing the conductive pattern including the strip lines without a short circuit therebetween on the upper surface of the dielectric 40, and the plate structures respectively connected to the ends of the strip lines and a fourth operation of attaching the lower surface of the dielectric 60 having the conductive pattern to the surfaces of the block member having a hexahedron shape.

Figure 12:
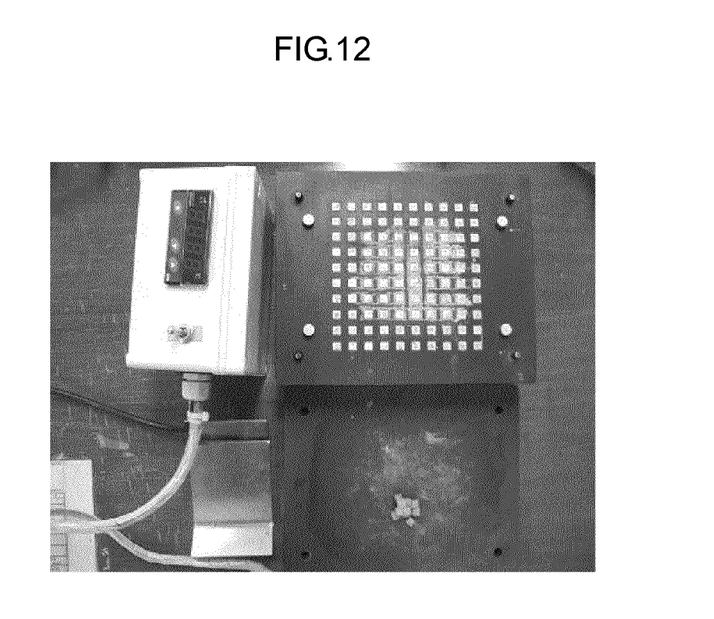
FIG. 12 is an image illustrating a mold for manufacturing a block member according to an embodiment of the present invention.

Referring to FIG. 12, in the first operation of manufacturing the block member for adjusting the specific gravity of the electromagnetic shielding structure 9, a mold for manufacturing a concrete block as the block member is manufactured, a waterproof agent preventing concrete from being adhered to the mold is applied on the mold, concrete is injected into the mold, and then, the concrete is taken out of the mold, so as to obtain, the block member having a rectangular parallelepiped or regular hexahedron shape with a predetermined size. The length of the block member is greater than those of the plate structures. For example, the length of the block member may range from about 5 mm to about 12 mm. The mold may include a heating wire for improve the evaporation speed of moisture from concrete.

In the second operation of manufacturing the 'T'-shaped dielectric 60 having a film shape for covering the surfaces of the block member obtained through the first operation, the 'T'-shaped dielectric 60 has a size corresponding to the whole surfaces of the block member. The dielectric 60 may include a head (not shown) and a body (not shown). The head has a horizontal straight line shape. The body has a vertical straight line shape that protrudes downward from the middle of the head.

In the third operation, the conductive pattern including the strip lines 10, 30, and 40 without a short circuit therebetween, and the plate structures 24, 26, 34, 36, 44, and 46 respectively connected to the ends of the strip lines 10, 30, and 40 is printed on the upper surface of the dielectric 60 manufactured through the second operation. More particularly, the strip lines 10, 30, and 40 are referred to as a first strip line, a second strip line, and a third strip line, respectively. The plate structures 24, 26, 34, 36, 44, and 46 are referred to as a first plate structure, a second plate structure, a third plate structure, a fourth plate structure, a fifth plate structure, and a sixth plate structure, respectively. The first and second plate structures 24 and 26 are provided to the head. The first strip line 10 connects the first plate structure 24 to the second plate structure 26. The third plate structure 34 is disposed between the first and second plate structures 24 and 26 in the head. The fourth plate structure 36 is disposed in the body. The second strip line 30 connects the third plate structure 34 to the fourth plate structure 36. The fifth plate structure 44 is disposed between the third and fourth plate structures 34 and 36. The sixth plate structure 46 is disposed under the fourth plate structure 36. The third strip line 40 connects the fifth plate structure 44 to the plate structure 46.

In the fourth operation, the lower surface of the dielectric 60 is attached to the surfaces of the block member having a hexahedron shape. The lower surface of the dielectric 40 may be provided with an adhesive member (not shown) for attaching the block member 30. The adhesive member is any member through which the dielectric 60 is attached to the block member formed of concrete. For example, the adhesive member may be a double sided tape.

An operation of coating the conductive pattern printed on the upper surface of the dielectric 40 to prevent corrosion of the conductive pattern due to contact with the block member 30 may be disposed between the third and fourth operations.

The present invention is described in more detail according to the following embodiment that is for illustrative purposes only and is not intended to limit the scope of the present invention.

[EMBODIMENT: Six-way Electromagnetic Shielding Structure]

Electromagnetic shielding structures were attached to a concrete block member, so that the electromagnetic shielding structures were formed in a single block having a size of 10.922 cm×5.461 cm, which was the same as the size of a wave guide to which the electromagnetic shielding structures are applied.

EXPERIMENTAL EXAMPLE

1) Measurement System

Figure 13:
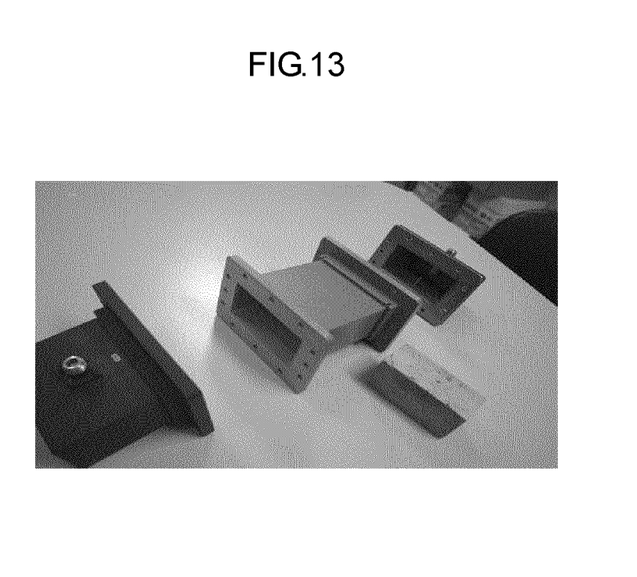
FIG. 13 is a perspective view illustrating a connector and a waveguide for measuring the electromagnetic shielding characteristics of a single sample, according to an embodiment of the present invention.

A WR-430 standard waveguide, ranging from about 1.7 GHz to about 2.6 GHz, was used to measure electromagnetic shielding characteristics. The WR-430 standard waveguide had a size of 10.922 cm×5.461 cm. FIG. 13 is a perspective view illustrating a measurement jig for measuring the electromagnetic shielding characteristics of a single sample. The jig included a connector and the waveguide.

In a measurement system, a Wiltron 360B vector network analyzer was connected to the measurement jig through an R-Band waveguide to coaxial connector. The connector was a model 08093-NF10 of Flann microwave, Inc. of Great Britain. The measurement jig was formed of copper.

The electromagnetic shielding structures manufactured according to the embodiment were loaded as the single sample into the jig and tested.

2) Measurement of Electromagnetic Shielding Characteristics

Figure 14:
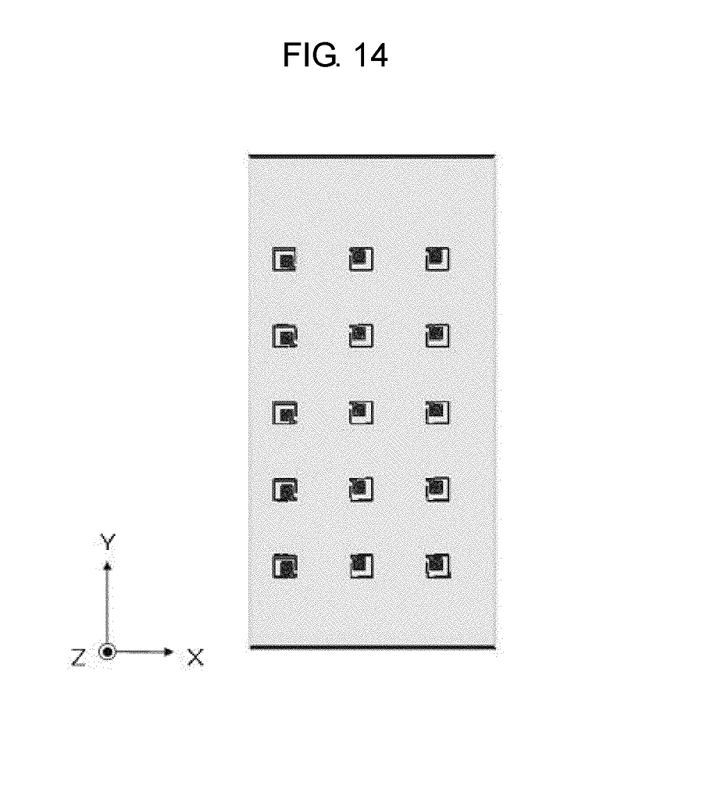
FIG. 14 is a cross-sectional view illustrating electromagnetic shielding structures provided to an electromagnetic shielding construction, according to an embodiment of the present invention.

Referring to FIG. 14, the electromagnetic shielding structures were arrayed in a 5×3 matrix with five rows arrayed along a y-axis, three columns arrayed along an x-axis, and a single layer along a z-axis in the waveguide. The dielectric constant of a medium in the waveguide was set to about 6, which is the dielectric constant of concrete.

Transmission characteristics of the electromagnetic shielding structures arrayed as illustrated in FIG. 14 were measured with the Wiltron 360B vector network analyzer. Input loss due to the concrete medium in the waveguide ranged from about −5 dB to about −10 dB. A stopband width ($\leq$−20 dB) was about 420 MHz, and a stopband width ($\leq$−30 dB) was about 150 MHz with respect to a cutoff resonance frequency of about 2.04 GHz.

The electromagnetic shielding structure according to the present invention effectively shields electromagnetic waves to improve a resident's health and prevent the malfunction of electronic devices due to electromagnetic waves. Particularly, the areas of the plate structures, the lengths of the strip lines (the distances between the plate structures), and the areas of the CSRR structures are adjusted to shield an electromagnetic wave having a specific frequency band. In addition, the electromagnetic shielding structures having different cutoff bands from each other are mixed to adjust the width of a cut off frequency band.

In addition, since the electromagnetic shielding structures include the block members for adjusting the specific gravity of the electromagnetic shielding structures, the electromagnetic shielding structures are uniformly distributed in a construction for shielding electromagnetic waves. That is, the electromagnetic shielding structures are uniformly distributed without variation in density in a construction formed of material, such as concrete, having fluidity during construction.

Thus, the variation in an electromagnetic shielding performance according to the positions of the electromagnetic shielding structures is prevented so as to construct a reliable electromagnetic shielding building. When a building is constructed with the electromagnetic shielding structures, shield electromagnetic waves are simply and permanently shielded in a predetermined space. In addition, the electromagnetic shielding structures are modified or the density of the electromagnetic shielding structures provided to a building is adjusted to freely select an electromagnetic wave having a frequency to be filtered.

In addition, the method of manufacturing an electromagnetic shielding structure in accordance with the present invention is simpler than a related art one, and the electromagnetic shielding structure is miniaturized. Thus, the number of conductors to be used can be decreased to reduce the entire manufacturing cost.

Furthermore, the electromagnetic shielding structures are attached to concrete to be embedded in a building. Thus, the effect of the electromagnetic shielding structures is permanent, an electromagnetic wave having a predetermined frequency band and transmitted in all directions of the building is effectively shielded to improve a resident's health and prevent the malfunction of electronic devices due to electromagnetic waves. In addition, the electromagnetic shielding structure attached to concrete functions as an artificial pebble to improve the physical properties of the concrete.

As such, the electromagnetic shielding structures including the block members are used in a construction requiring the shielding of electromagnetic waves, such as security facilities, medical facilities concerning the malfunction of medical appliances due to electromagnetic interference, and examination rooms concerning cheating through communication devices, so as to fundamentally shield electromagnetic waves.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An electromagnetic shielding structure comprising:
   a strip line; and
   a couple of plate structures facing each other and connected to both ends of the strip line,
   wherein the strip line comprises: a first horizontal strip line and a second horizontal strip line protruding from the plate structures and horizontal to the plate structures; and
   a vertical strip line connecting the first and second horizontal strip lines.

2. The electromagnetic shielding structure of claim 1, wherein the strip line and the plate structures are conductors.

3. The electromagnetic shielding structure of claim 1, wherein the plate structures have complementary split ring resonator (CSRR) structures, respectively.

4. The electromagnetic shielding structure of claim 1, further comprising a block member coupled to the plate structures between the plate structures and adjusting a specific gravity of the electromagnetic shielding structure.

5. The electromagnetic shielding structure of claim 4, wherein the block member is coupled to the plate structures covering one of back-and-forth, left-and-right and up-and-down directions of the block member, to the strip line connecting the plate structures, to two couples of plate structures covering the rest of the back-and-forth, left-and-right and up-and-down directions, and to strip lines respectively connecting the two couples of the plate structures.

6. An electromagnetic shielding structure comprising:
a dielectric having a film shape; a strip line printed on an upper surface of the dielectric; and
a couple of plate structures printed on the upper surface of the dielectric and connected to both ends of the strip line,
wherein the plate structures and the strip lines are conductors, and the plate structures have complementary split ring resonator (CSRR) structures, respectively.

7. The electromagnetic shielding structure of claim 6, wherein a length of the strip line, a size of the plate structure, and a radius of the complementary split ring resonator (CSRR) structure are adjusted to select a frequency of an electromagnetic wave to be shielded.

8. The electromagnetic shielding structure of claim 6, wherein the strip line is provided in triplicate, and the strip lines are printed without a short circuit therebetween on the upper surface of the dielectric, and three couplings of the plate structures are provided such that each coupling of the plate structures are connected to both ends of each of the three strip lines, and face each other.

9. The electromagnetic shielding structure of claim 6, further comprising a block member adhered to a lower surface of the dielectric to adjust a specific gravity of the electromagnetic shielding structure.

\* \* \* \* \*